United States Patent
Choung et al.

(10) Patent No.: US 8,173,494 B2
(45) Date of Patent: May 8, 2012

(54) THIN FILM TRANSISTOR ARRAY AND METHOD OF MANUFACTURING THE SAME

(75) Inventors: Jong-Hyun Choung, Suwon-si (KR);
Hong-Sick Park, Suwon-si (KR);
Joo-Ae Youn, Seongnam-si (KR);
Sun-Young Hong, Yongin-si (KR);
Bong-Kyun Kim, Incheon (KR);
Won-Suk Shin, Yongin-si (KR);
Byeong-Jin Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/890,324

(22) Filed: Sep. 24, 2010

(65) Prior Publication Data

US 2011/0014737 A1    Jan. 20, 2011

Related U.S. Application Data

(62) Division of application No. 11/986,330, filed on Nov. 20, 2007, now Pat. No. 7,816,712.

(30) Foreign Application Priority Data

Nov. 21, 2006    (KR) .................. 10-2006-0114990

(51) Int. Cl.
*H01L 21/00* (2006.01)

(52) U.S. Cl. ................ 438/149; 438/257; 257/E21.094; 257/E21.104; 257/E21.121; 257/E21.372; 257/E21.411

(58) Field of Classification Search .................. 438/149, 438/257; 257/E21.094, E21.104, E21.121, 257/E21.372, E21.411
See application file for complete search history.

(56) References Cited

U.S. PATENT DOCUMENTS

| | | | |
|---|---|---|---|
| 6,912,024 B2 | 6/2005 | Kim et al. | |
| 7,504,661 B2* | 3/2009 | Jung | ................................. 257/59 |
| 2005/0101044 A1* | 5/2005 | Cho et al. | ........................ 438/30 |
| 2005/0263768 A1 | 12/2005 | Ahn | |
| 2006/0138426 A1 | 6/2006 | Yoo et al. | |
| 2007/0001170 A1* | 1/2007 | Jung | ............................... 257/59 |
| 2007/0013820 A1 | 1/2007 | Jeoung | |

* cited by examiner

*Primary Examiner* — Long Tran
(74) *Attorney, Agent, or Firm* — Innovation Counsel LLP

(57) ABSTRACT

A thin film transistor array and method of manufacturing the same include a pixel electrode formed of a transparent conductive layer on a substrate, a gate line formed of the transparent conductive layer and an opaque conductive layer on the substrate, a gate electrode connected to the gate line and formed of the transparent conductive layer and an opaque conductive layer on the substrate, a gate insulating layer which covers the gate line and the gate electrode, a semiconductor layer formed on the gate insulating layer to overlap the gate electrode, a data line which intersects the gate line, a source electrode connected to the data line to overlap a part of the semiconductor layer, and a drain electrode connected to the pixel electrode to overlap a part of the semiconductor layer.

13 Claims, 12 Drawing Sheets

THIN FILM TRANSISTOR ARRAY AND METHOD OF MANUFACTURING THE SAME

CROSS-REFERENCE TO RELATED APPLICATIONS

This application is a divisional of, and claims benefit of, U.S. patent application Ser. No. 11/986,330, filed on Nov. 20, 2007, which claims priority to Korean Patent Application No. 10-2006-114990, filed on Nov. 21, 2006, where the disclosures of both applications are hereby incorporated herein by reference in their entireties for all purposes.

BACKGROUND

1. Field of the Disclosure

The present disclosure of invention relates to a thin film transistor ("TFT") array and a method of manufacturing the TFT array 2. Description of Related Art An active matrix display device, such as a liquid crystal display ("LCD") device or an organic light emitting diode ("OLED"), includes a plurality of pixels which are arranged in a matrix form. Each pixel includes an electric field generating electrode and a switching element.

The switching element uses a TFT having a gate electrode, a drain electrode, and a source electrode. A gate signal is applied to the gate electrode of the TFT. The TFT then supplies a data signal to a source electrode which supplies a signal to the electric field generating electrode in response to the gate signal applied to the gate electrode.

The TFT array includes a gate line and a data line, which supply signals to the TFT. Accordingly, the TFT array comprises a substrate on which the TFT and the gate and data lines are formed.

The TFT array has a layered structure in which conductive layers and insulating layers are stacked. The TFT array having such a layered structure is manufactured by a plurality of photolithographic and etching processes. Since these processes are expensive and time consuming, the manufacturing cost of the TFT array is high. Further, since these processes include at least the steps of thin film deposition, ashing, photoresist coating, exposure, developing, etching, and photoresist stripping, and other like steps as would be known to a person of ordinary skill in the art, there is significant risk that defects in the TFT array may occur during such steps. Therefore, it is advantageous to reduce the number of such steps in the photolithographic and etching processes.

SUMMARY

The present disclosure provides a TFT array and method of manufacturing the TFT array in which a three-mask process is used, an ohmic contact layer has a small-sized protrusion portion, and a drain electrode and a pixel electrode have good contact characteristics.

In an exemplary TFT array according to the present disclosure, the TFT array comprises a pixel electrode formed of a transparent conductive layer on a substrate, a gate line formed of a transparent conductive layer and an opaque conductive layer on the substrate, a gate electrode connected to the gate line and formed of a transparent conductive layer and an opaque conductive layer on the substrate, a gate insulating layer which covers the gate line and the gate electrode, a semiconductor layer formed on the gate insulating layer to overlap the gate electrode, a data line which intersects the gate line, a source electrode connected to the data line to overlap a part of the semiconductor layer, and a drain electrode connected to the pixel electrode to overlap a part of the semiconductor layer, wherein the impurity doped amorphous silicon layer of the semiconductor layer is not or is minimally exposed outside the source electrode and the drain electrode.

In an exemplary method of manufacturing a TFT array according to this present invention, the method comprises sequentially forming a transparent conductive layer and an opaque conductive layer on a substrate, forming a gate pattern having a gate line, a gate electrode, and a pixel electrode by patterning the transparent conductive layer and the opaque conductive layer using a first mask, forming a gate insulating layer and a semiconductor layer on the substrate, patterning the semiconductor layer and the gate insulating layer using a second mask, removing the opaque conductive layer on the pixel electrode using the second mask, forming a conductive layer on the substrate, forming a third photoresist pattern using a third mask, forming a source/drain pattern having a data line, a source electrode, and a drain electrode by patterning the conductive layer using the third photoresist pattern, modifying the third photoresist pattern into a fourth photoresist pattern corresponding to the source/drain pattern, and removing the impurity doped amorphous silicon layer of the semiconductor layer between the source electrode and the drain electrode using the fourth photoresist pattern.

BRIEF DESCRIPTION OF THE DRAWINGS

The features of the present invention will become more apparent to those of ordinary skill in the art by describing in detail exemplary embodiments thereof with reference to the attached drawings, in which.

DETAILED DESCRIPTION

Figure 1:
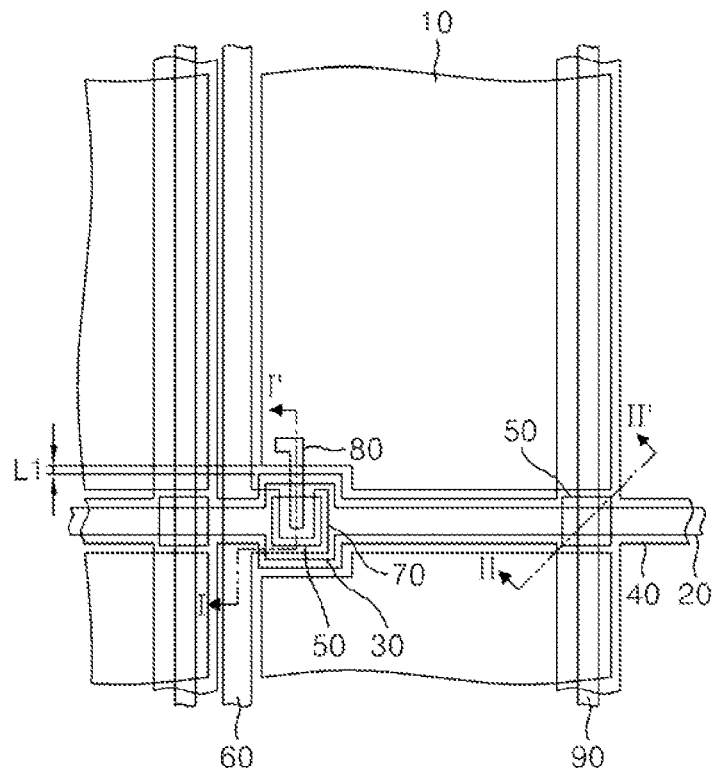
FIG. 1 is a plan view showing a structure of a TFT array according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those of ordinary skill in the art. In the drawings, the use of the same reference symbols in different figures indicates similar or identical items.

It will be understood that when an element such as a layer, film, region or substrate is referred to as being "on", "connected to", or "coupled to" another element or layer, it can be directly on, directly connected to, or directly coupled to the other element or layer, or intervening elements or layers may also be present. In contrast, when an element is referred to as being "directly on", "directly connected to", or "directly coupled to" another element or layer, there are no intervening elements or layers present.

Hereinafter, a TFT array according to an exemplary embodiment of the present invention is described below in detail with reference to FIGS. 1 and 2A. FIG. 1 is a plan view showing a structure of the TFT array according to an exemplary embodiment of the present invention and FIG. 2A is a cross-sectional view taken along lines I-I' and II-II' of FIG. 1.

Figure 2A:
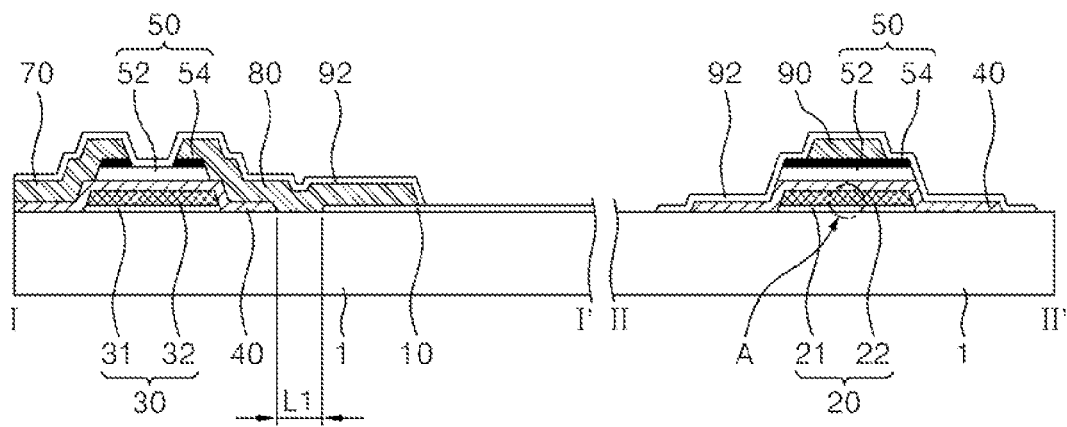
FIG. 2A is a cross-sectional view showing a structure of a TFT array according to an exemplary embodiment of the present invention taken along lines I-I' and II-II' of FIG. 1.

As shown in FIGS. 1 and 2A, the TFT array according to an exemplary embodiment includes a pixel electrode 10, a gate line 20, a gate electrode 30, a gate insulating layer 40, a semiconductor layer 50, a data line 60, a source electrode 70, a drain electrode 80, and a storage line 90.

The pixel electrode 10 is formed of a transparent conductive layer on a substrate 1. Herein, the substrate 1 is formed of transparent glass or plastic. As shown in FIG. 1, the pixel electrode 10 is formed all over a pixel area of a rectangular shape made by an intersection of the gate line 20 and the data line 60.

Although the transparent conductive layer constituting the pixel electrode 10 is preferably an amorphous indium-tin-oxide ("ITO") showing a good profile during an etching process, the transparent conductive layer may be a transparent conductive material such as ITO or indium-zinc-oxide ("IZO"), or a reflective metal such as aluminum ("Al"), silver ("Ag"), chromium ("Cr"), or an alloy of Al, Ag or Cr, or other like materials as would be known to a person of ordinary skill in the art.

The gate line 20 supplies a scan signal and extends in a row direction. In this exemplary embodiment, the gate line 20 comprises a transparent conductive layer 21 formed on the substrate 1 and an opaque conductive layer 22 formed on the transparent conductive layer 21. Herein, the transparent conductive layer 21 is substantially the same as the transparent conductive layer constituting the pixel electrode 10. Therefore, the transparent conductive layer constituting the pixel electrode 10 and the transparent conductive layer 21 of the gate line 20 are formed by patterning the same transparent conductive layer.

Figure 2B:
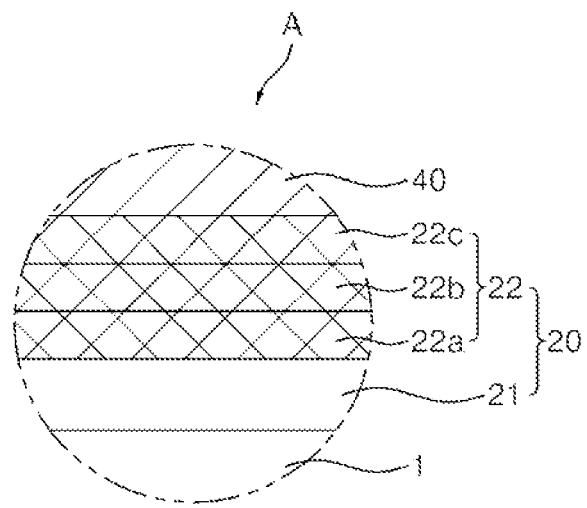
FIG. 2B is an enlarged view showing a portion "A" of FIG. 2A according to an exemplary embodiment of the present invention.
Figure 2C:
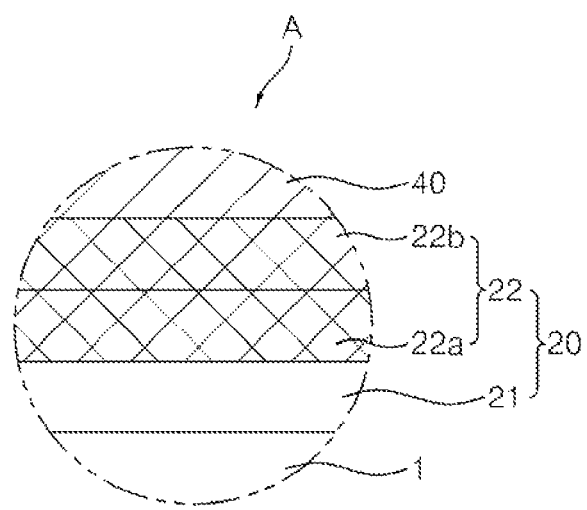
FIG. 2C is an enlarged view showing a portion "A" of FIG. 2A according to another exemplary embodiment of the present invention which uses one less layer of material for the opaque conductive layer 22.

FIG. 2B is an enlarged view showing a portion "A" of FIG. 2A according to an exemplary embodiment of the present invention, and FIG. 2C is an enlarged view showing a portion "A" of FIG. 2A according to another exemplary embodiment of the present invention.

As shown in FIG. 2B, the opaque conductive layer 22 of the gate line 20 is formed on the transparent conductive layer 21 of gate line 20 and has a triple layer structure in which a first layer 22a, a second layer 22b, and a third layer 22c are stacked. The first layer 22a is made of a refractory metal having good contact characteristics with an amorphous ITO, or an alloy thereof. The second layer 22b is made of Al, an Al-based metal, Ag, an Ag-based metal, copper (Cu) or a Cu-based metal having low resistivity. The third layer 22c is made of a refractory metal such as molybdenum ("Mo"), chrome ("Cr"), tantalum ("Ta"), or titanium ("Ti") or an alloy of Mo, Cr, Ta or Ti. Said first, second and third layers, respectively, may be composed of other like materials as would be known to a person of ordinary skill in the art. An example of the triple layer structure may be the first layer 22a of Mo or a Mo alloy, the second layer 22b of Al, or an Al alloy, and the third layer 22c of Mo or a Mo alloy.

Further, as shown in FIG. 2C, layer 22 of the gate line 20 may have a double layer structure in which the first layer 22a is of a refractory metal material and the second layer 22b is of a metal material having low resistivity. An example of the double layers may be the first layer 22a of Cr, Mo, a Cr alloy or a Mo alloy and the second layer 22b of Al or an Al alloy. Alternatively, the layer 22 of the gate line 20 may have a single opaque conductive layer structure.

The gate electrode 30 is connected to the gate line 20 to supply a scan signal to a TFT. In this exemplary embodiment, the gate electrode 30 has, as shown in FIG. 1, a plan structure in which a part of the gate line 20 is extended in widths. The gate electrode 30 is formed along with the gate line 20 and has the same structure as the gate line 20. Namely, the gate electrode 30 includes a transparent conductive layer 31 and an opaque conductive layer 32 as shown in FIG. 2A. Therefore, a detailed description of the gate electrode 30 is not required and is omitted.

The gate insulating layer 40 covers the gate line 20 and the gate electrode 30 to insulate them from other layers as shown in FIG. 2A. The gate insulating layer 40 is formed of silicon nitride (SiNx) or silicon oxide (SiOx). In this exemplary embodiment, the gate insulating layer 40 does not overlap the pixel electrode 10 so as to increase an aperture ratio of a pixel and covers only the gate line 20 and the gate electrode 30.

When forming the storage line 90, as shown in FIG. 1, the gate insulating layer 40 is formed to overlap the pixel electrode 10 only at an area where the storage line 90 overlaps the pixel electrode 10. In particular, the gate insulating layer 40 is not formed at an area where the drain electrode 80 contacts the pixel electrode 10. Therefore, contact characteristics of the drain electrode 80 and the pixel electrode 10 are very good, which is described later in more detail. An area where the gate insulating layer 40 overlaps the pixel electrode 10 is disposed between the storage line 90 and the pixel electrode 10 to form a storage capacitor.

The semiconductor layer 50 is formed of a semiconductor 52 and an ohmic contact layer 54 to overlap the gate electrode 30. The semiconductor layer 50 forms a channel between the source electrode 70 and the drain electrode 80. In this exemplary embodiment, the semiconductor layer 50 is formed to have an area narrower than the width of gate electrode 30 as shown in FIG. 2A.

If the semiconductor layer 50 is exposed outside the gate electrode 30, a leakage current may occur when the TFT array is used in an LCD device. In other words, a photoelectric current may be generated in the exposed semiconductor layer by light emitted from a backlight of the LCD device, thus deteriorating the TFT's properties and generating a display defect in the LCD device. However, in this exemplary embodiment, since the semiconductor layer 50 is located within the width of gate electrode 30, light emitted from the backlight is all blocked by the opaque conductive layer 32 of the gate electrode 30. As a result, light is not irradiated to the semiconductor layer 50 and a leakage current is not generated. Therefore, the TFT according to this exemplary embodiment has the superior property of not generating the leakage current.

The semiconductor layer 50 is formed of a semiconductor 52 and an ohmic contact layer 54 formed on the semiconductor 52. The semiconductor 52 is formed of hydrogenated amorphous silicon, polysilicon or like materials as would be known to a person of ordinary skill in the art. The ohmic contact layer 54 may be formed of n+ hydrogenated amorphous silicon highly doped with an n-type impurity, or silicide. The ohmic contact layer 54 is formed in a pair on the semiconductor 52 to reduce a difference of the work function between the semiconductor 52 and the source electrode 70 and between the semiconductor 52 and the drain electrode 80.

In this exemplary embodiment, as shown in FIGS. 1 and 2A, the semiconductor layer 50 which is comprised of semiconductor 52 and an ohmic contact layer 54, is additionally formed in an island shape at an area where the storage line 90 overlaps the gate line 20. The semiconductor layer 50 is disposed between the gate line 20 and the storage line 90 to insulate the gate line 20 so as not to interfere with a scan signal passing through the gate line 20 with a common voltage passing through the storage line 90. Accordingly, as shown in FIG. 2A, the semiconductor layer 50 is formed to be wider than the width of the gate line 20 to insulate the gate line 20 the from storage line 90.

The data line 60 supplies a pixel signal. As shown in FIG. 1, the data line 60 extends in a column direction and intersects the gate line 20. The drain electrode 80 is separated from the data line 60 and faces the source electrode 70 with respect to the gate electrode 30. In this exemplary embodiment, the drain electrode 80 is L-shaped, as shown in FIG. 2A. The source electrode 70 is connected to the data line 60 and is C-shaped, as shown in FIG. 1. One end of the drain electrode 80 is surrounded by the C shaped form of the source electrode 70 and the other end of the drain electrode 80 overlaps the pixel electrode 10.

According to the above structure, while a scan signal is applied to the gate electrode 30, the source electrode 70 supplies the pixel signal to the drain electrode 80 through a channel formed by the semiconductor 52 and the drain electrode 80 supplies the pixel signal to the pixel electrode 10.

As described above, a part of the drain electrode 80 contacts the pixel electrode 10 to form a contact portion. In this exemplary embodiment, however, the drain electrode 80 directly contacts the pixel electrode 10 without the gate insulating layer 40 intervening between the drain electrode 80 and the pixel electrode 10. As shown in FIG. 2A, since the pixel electrode 10 is formed of only a thin transparent conductive layer, a part of the drain electrode 80 directly overlaps the thin transparent conductive layer of the pixel electrode 10 to advantageously have good contact characteristics.

The storage line 90 overlaps a part of the pixel electrode 10 with the gate insulating layer 40 disposed there between and is formed in parallel with the data line 60.

The storage line 90 in conjunction with the pixel electrode 10 and the gate insulating layer 40 constitutes a storage capacitor to stably maintain a pixel voltage applied to the pixel electrode 10 as shown in FIG. 1. If an area where the storage line 90 overlaps the pixel electrode 10 becomes wider, then the aperture ratio is reduced. On the other hand, if the area where the storage line 90 overlaps the pixel electrode 10 becomes narrower, then the capacity of the storage capacitor is reduced. Therefore, the width of the storage line 90 should be suitably decided, and it is preferably formed to be as small as possible.

In this exemplary embodiment, the data line 60, the source electrode 70, the drain electrode 80, and the storage line 90 are made of the same material, for example, a refractory metal such as Mo, Cr, Ta, or Ti or an alloy of Mo, Cr, Ta, Ti or such like materials as would be known to a person on ordinary skill in the art. Further, the data line 60, the source electrode 70, the drain electrode 80, and the storage line 90 may have a multi-layer structure including a refractory metal layer and a low resistance conductive layer. Examples of the multilayer structure may be a double layer of a lower layer of Cr, Mo, Cr alloy or Mo alloy and an upper layer of Al or Al alloy, and a triple layer of a lower layer of Mo or a Mo alloy, a middle layer of Al or an Al alloy, and an upper layer of Mo or a Mo alloy. The layers, respectively, of said multilayer structure may also be composed of like materials as would be known to a person of ordinary skill in the art.

A protective layer 92 is formed on the data line 60, the drain electrode 80, and the semiconductor 52 exposed, the storage line 90, and a part of the gate insulating layer 40. The protective layer 92 covers the gate line 20 extending in a row direction and the date line 60 extending in a column direction. The protective layer 92 has an expanding portion at an area where the source electrode 70 and the drain electrode 80 are formed.

The protective layer 92 may be formed of an inorganic insulating material or an organic insulating material and have a flat surface. Examples of the inorganic insulating material may be SiNx, SiOx and like materials as would be known to a person of ordinary skill in the art. The organic insulating material may have photosensitivity and a dielectric constant of less than about 4.0. Meanwhile, the protective layer 92 may have a double layer of a lower inorganic layer and an upper organic layer so as to have good insulating characteristics of an organic layer and to not damage the exposed semiconductor 52.

A method of manufacturing the TFT array according to an exemplary embodiment of the present invention is described below in detail with reference to FIGS. 3A to 9.

Figure 3A:
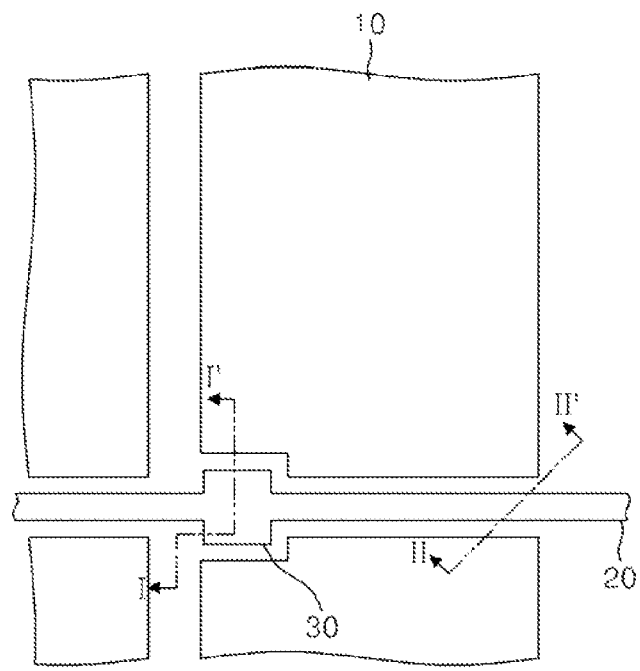
FIGS. 3A and 3B are plan and cross-sectional views, respectively, showing a first mask process in a method of manufacturing the TFT array according to an exemplary embodiment of the present invention.
Figure 3B:
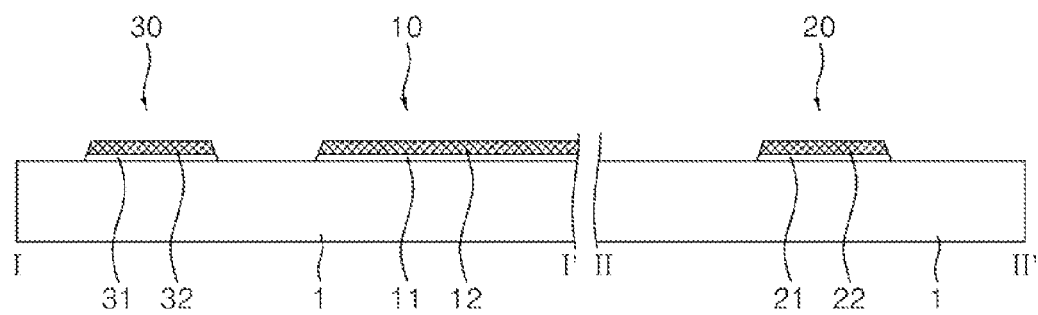

FIGS. 3A and 3B are plan and cross-sectional views, respectively, showing a first mask process in a method of manufacturing the TFT array according to an exemplary embodiment of the present invention.

As shown in FIGS. 3A and 3B, an amorphous ITO layer is deposited on the insulating substrate 1 made of a transparent glass, plastic or like material as would be known to a person of ordinary skill in the art, by a sputtering or similar method as would be known to a person of ordinary skill in the art to form a transparent conductive layer. Then, an opaque conductive multi-layer structure having, for example, a lower layer of Mo, a middle layer of Al, and an upper layer of Mo is deposited by a sputtering method or similar method as would be known to a person of ordinary skill in the art. Examples of such multi-layer structures are shown in FIGS. 2B and 2C. Alternative combinations described above may also be utilized. Thereafter, a photoresist layer (not shown) with a thickness of about 1 μm to 2 μm is deposited on the opaque conductive multi-layer structure.

A first mask (not shown) is aligned over the substrate 1, and then the photoresist layer is exposed through the first mask. At this time, the first mask has transmission portions corresponding to areas where the pixel electrode 10, the gate line 20 and the gate electrode 30 are to be formed and light-blocking portions corresponding to the other areas. In this way, since the first mask is a general mask, not a slit mask, the first mask process is simple.

The exposed photoresist layer is then developed to form a photoresist pattern (not shown). The transparent conductive layer and the opaque conductive layer at an area except for an area covered by the photoresist pattern are removed by an etching process using the photoresist pattern as an etching mask. At this time, the transparent conductive layer and the opaque conductive layer may be removed by an etching solution at one time, and sequentially removed by using an etching process more than once. The photoresist pattern is then removed by a stripping process to form a gate pattern having the gate line 20, the gate electrode 30, and the pixel electrode 10, as shown in FIG. 3B. In particular, the structure which deposits the transparent conductive layer 11 and the opaque conductive layer 12 is maintained even at an area where the pixel electrode 10 is to be formed.

Figure 4A:
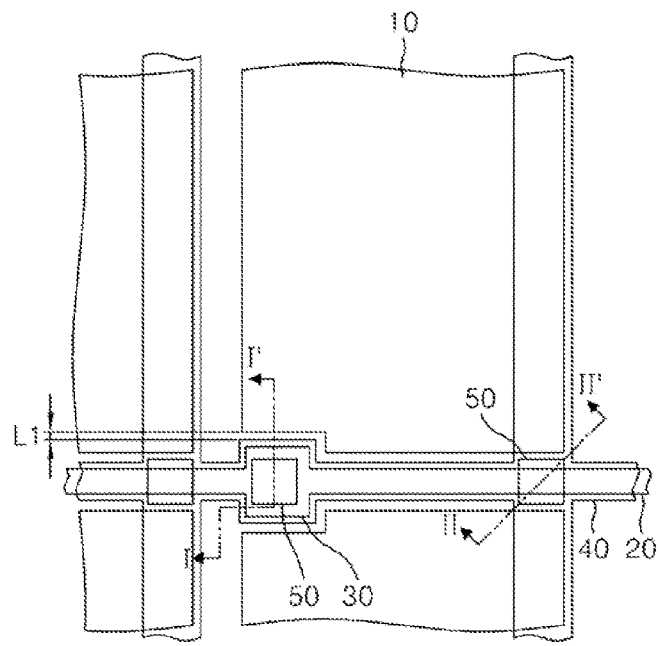
FIGS. 4A and 4B are plan and cross-sectional views, respectively, showing a second mask process in the method of manufacturing the TFT array according to an exemplary embodiment of the present invention.
Figure 4B:
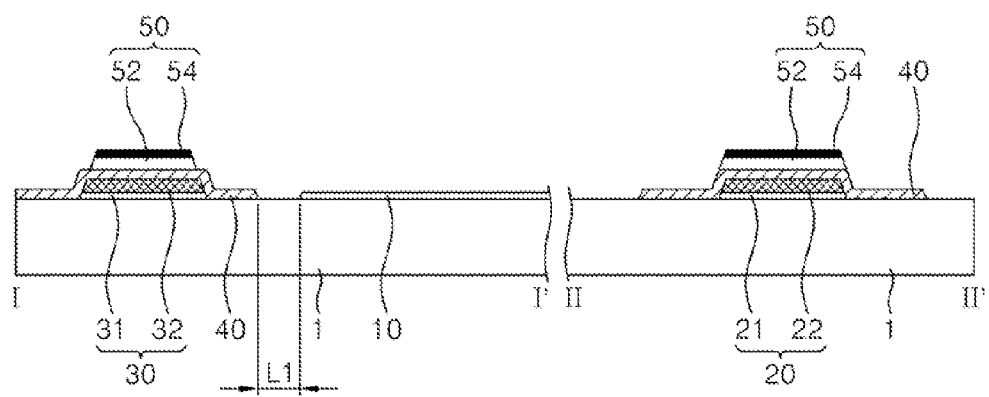

FIGS. 4A and 4B are plan and cross-sectional views, respectively, illustrating a second mask process in the method of manufacturing the TFT substrate according to an exemplary embodiment of the present invention.

As shown in FIGS. 4A and 4B, a gate insulating layer 40, an impurity undoped intrinsic hydrogenated amorphous silicon layer 52, and highly doped n+ hydrogenated amorphous silicon layer 54 are sequentially deposited by a plasma-enhanced chemical vapor deposition ("PECVD") method, or similar method as would be known to a person of ordinary skill in the art, and then etched to form the semiconductor layer 50 and gate insulating layer 40. The second mask process is described in detail below with reference to FIGS. 5A to 5H.

Figure 5A:
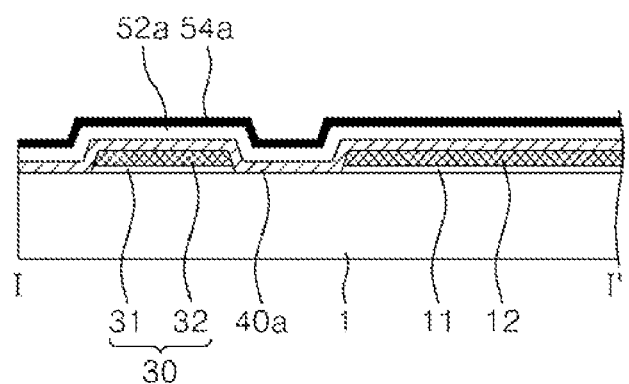
FIGS. 5A to 5H are cross-sectional views showing details of the second mask process according to an exemplary embodiment of the present invention.

As shown in FIG. 5A, a gate insulating layer 40a, an impurity undoped intrinsic hydrogenated amorphous silicon layer 52a, and a highly doped n+ hydrogenated amorphous silicon layer 54a are sequentially deposited by a PECVD method, or similar method as would be known to a person of ordinary skill in the art. It is preferable that the gate insulating layer 40a is made of SiNx, and a deposition temperature is a low temperature of about 240 to 280° C. so as to prevent surface damage of the gate pattern deposited there under. Further, it is preferable that the thickness of the gate insulating layer 40a is about 2000 to 5000 Å. When the gate insulating layer 40a is formed, a deposition method by which lower gate pattern is not restored may be used instead of a low temperature deposition method. An amorphous ITO used as a material of a transparent conductive layer is changed into a poly ITO by heat generated in forming the gate insulating layer 40a, thus improving the transmittance of the pixel.

Figure 5B:
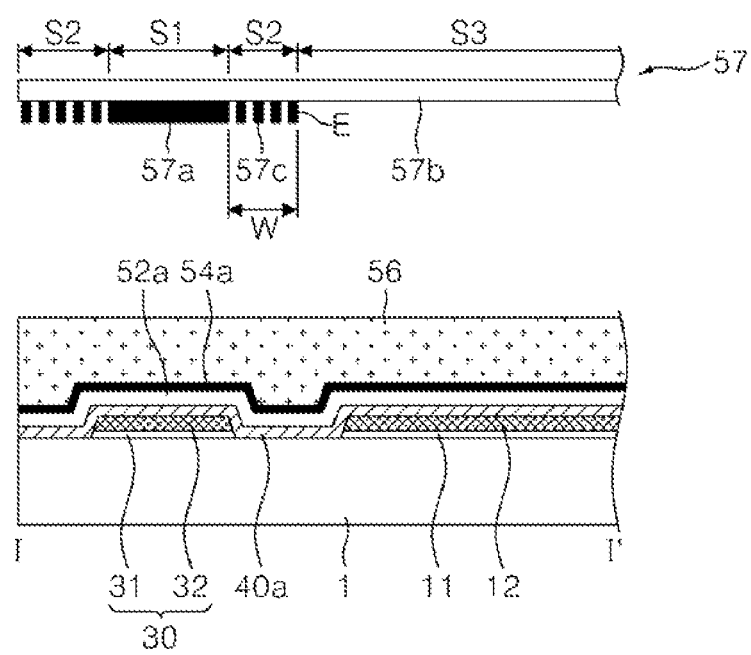

Then, as shown in FIG. 5B, a photoresist layer 56 with a thickness of about 1 to 2 μm is deposited on the highly doped n+ hydrogenated amorphous silicon layer 54a. A second mask 57 is aligned over the substrate 1. The second mask 57 is a slit mask unlike the first mask. Therefore, the second mask 57 includes, as shown in FIG. 5B, three areas, that comprise, a light-blocking area S1, a slit area S2, and a transmission area S3.

In the light-blocking area S1, a light-blocking layer 57a is formed on a quartz substrate 57b so as to completely block light. An upper portion of the gate electrode 30 where the semiconductor layer 50 and the gate insulating layer 40 are to remain and an upper portion of an intersection area of the gate line 20 and the storage line 90 correspond to the light-blocking area S1.

Then, the slit area S2 having slits 57c at constant intervals is formed on the quartz substrate 57b so as to partially transmit light and partially block light. An upper portion of the gate line 20 where the semiconductor layer 50 is to be removed and only the gate insulating layer 40 is to remain and an area where the storage line 90 is to be formed correspond to the slit area S2.

Then, the transmission area S3 indicates an area where only a transparent quartz substrate 57b exists so as to transmit all light, and corresponds to an area where the semiconductor layer and the gate insulating layer are all to be removed. In particular, an area where the drain electrode 80 and the pixel electrode 10 overlap corresponds to the transmission area S3, and therefore in the transmission area S3, the gate insulating layer 40 does not overlap the pixel electrode 10 (Refer to FIG. 5H).

In other words, the slit area S2 has a shorter width W than conventional embodiments so that the end portion E of the slit area S2 is arranged between the gate electrode 30 and the pixel electrode 10. As shown in FIG. 6B, the gate insulating layer 40 does not overlap the pixel electrode 10, the gate insulating layer 40 is spaced apart from the pixel electrode 10 by a predetermined distance L1. Therefore, the drain electrode 80 is directly formed on the pixel electrode 10, and the step coverage of the drain electrode 80 is improved.

In this exemplary embodiment, although the second mask 57 is a slit mask, since a slit area is a little wider than the width of the gate line 20, exposure and developing processes may be easily performed. Generally, when the slit area of a slit mask corresponds to a whole pixel area, there is a problem that a uniform exposure may not be performed.

Figure 5C:
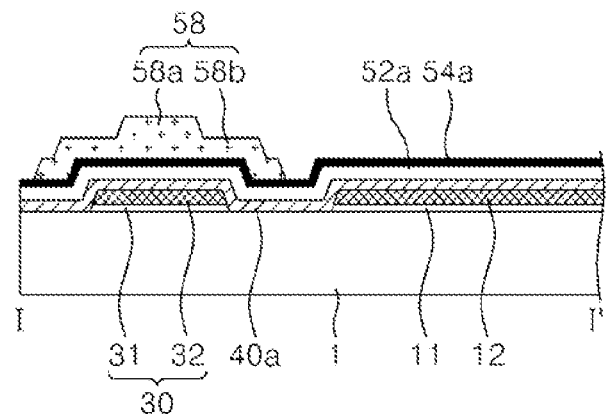

After exposing and developing the photoresist layer 56 using the second mask 57, as shown in FIG. 5C, a different thickness of a first photoresist pattern 58 based on the location of the second mask is obtained. Using the first photoresist pattern 58, the highly doped n+ hydrogenated amorphous silicon layer 54a, the intrinsic hydrogenated amorphous silicon layer 52a, and the gate insulating layer 40a are all removed as shown in FIG. 5D.

Figure 5D:
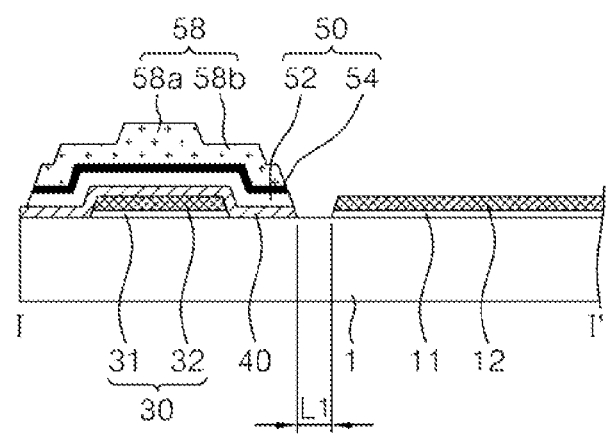
Figure 5E:
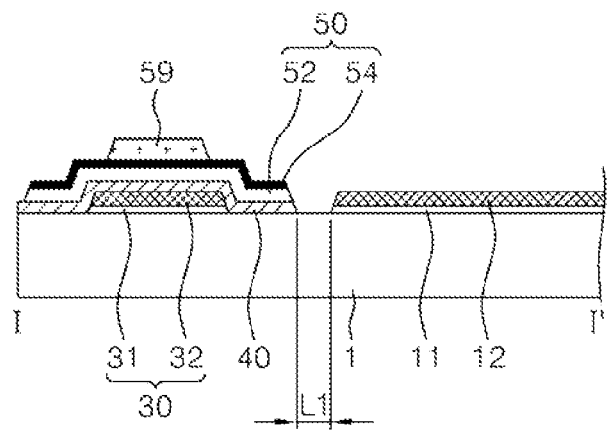
Figure 5F:
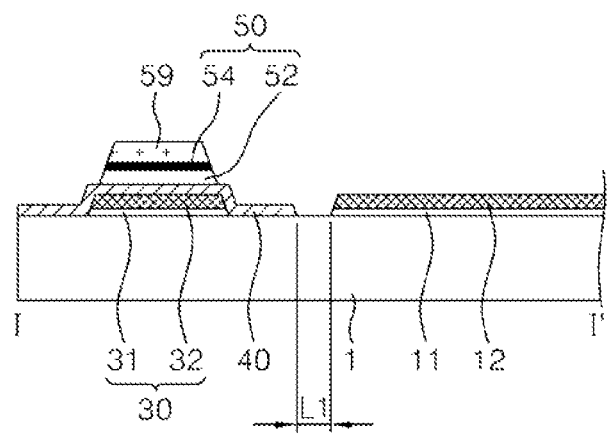

Then, as shown in FIG. 5E, a thin portion 58b as shown in FIG. 5D of the first photoresist pattern 58 is removed by an ashing process or such like process as would be known to a person of ordinary skill in the art, while the thickness of a thick portion 58a is reduced to form a second photoresist pattern 59. Then, the highly doped n+ hydrogenated amorphous silicon layer 54 and the intrinsic hydrogenated amorphous silicon layer 52 are sequentially etched using the second photoresist pattern 59 as an etching mask to obtain a second semiconductor pattern as shown in FIG. 5F. At this time, the opaque conductive layer 12 in a pixel electrode area is entirely exposed.

Figure 5G:
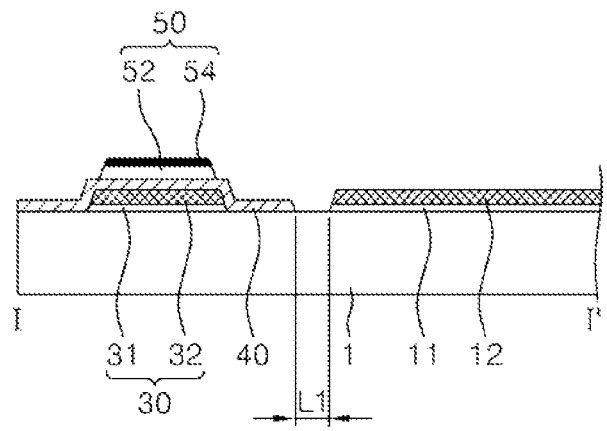
Figure 5H:
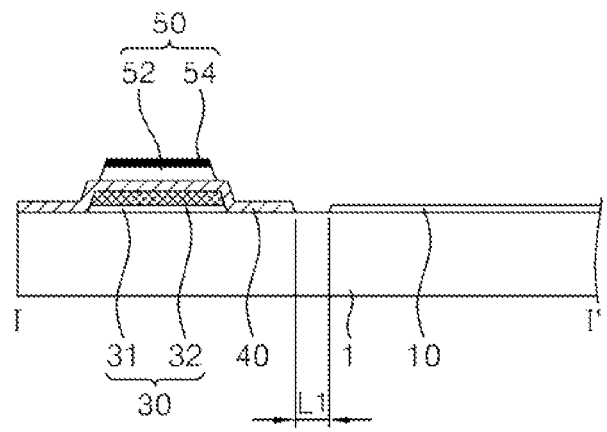

Then, as shown in FIG. 5G, the second photoresist pattern 59 is removed by a stripping process or such like process as would be known to a person of ordinary skill in the art. The opaque conductive layer 12 exposed in an area where the pixel electrode 10 is to be formed, is etched to expose the transparent conductive layer 11, as shown in FIG. 5H. Here, the transparent conductive layer 11 corresponds to a pixel electrode 10. Although an etching process removing the opaque conductive layer 12 is performed, since the opaque conductive layers of the gate line 20 and the gate electrode 30 are covered by the gate insulating layer 40, they are not influenced by the etching process.

Figure 5I:
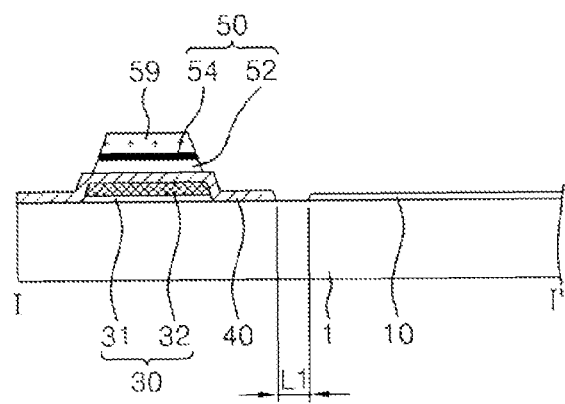
FIG. 5I is a cross-sectional view showing a second mask process according to another exemplary embodiment of the present invention.

Alternatively, when the opaque conductive layer 12 in the pixel electrode area is etched after removing the second photoresist pattern 59, since the semiconductor layer 50 may be influenced by an etching process, the second photoresist pattern 59 may be removed after etching and removing the opaque conductive layer 12 in the pixel electrode area, as shown in FIG. 5I.

Figure 6A:
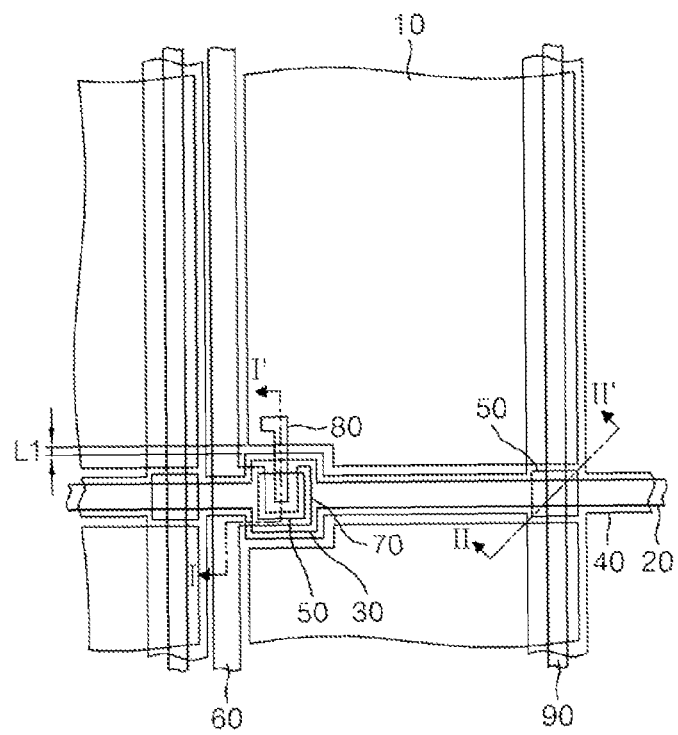
FIGS. 6A and 6B are plan and cross-sectional views, respectively, showing a third mask process in the method of manufacturing the TFT array according to an exemplary embodiment of the present invention.
Figure 6B:
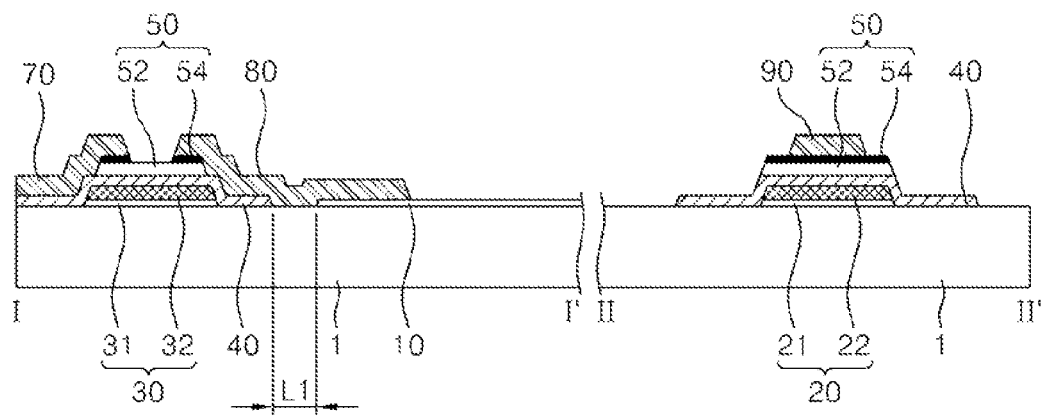

FIGS. 6A and 6B are plan and cross-sectional views, respectively, showing a third mask process in the method of manufacturing the TFT array according to an exemplary embodiment of the present invention.

As shown in FIGS. 6A and 6B, after depositing a metal conductive layer by a sputtering method, or like method as would be known to a person of ordinary skill in the art, a source/drain pattern having the source electrode 70, the drain electrode 80, the data line 60, and the storage line 90 are formed by photolithographic and etching processes.

Hereinafter, the third mask process is described below in detail with reference to FIGS. 7A to 7C.

Figure 7A:
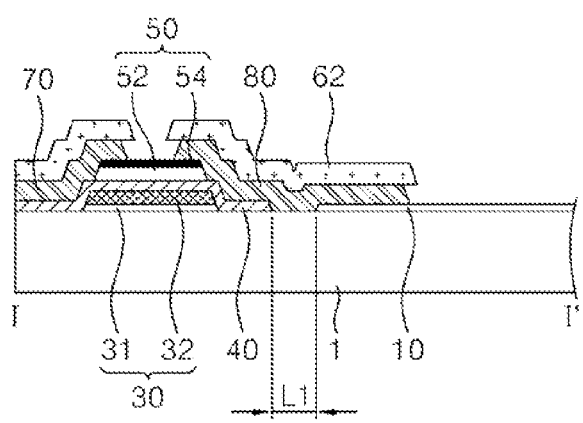
FIGS. 7A to 7C are cross-sectional views showing details of the third mask process according to an exemplary embodiment of the present invention.
Figure 7B:
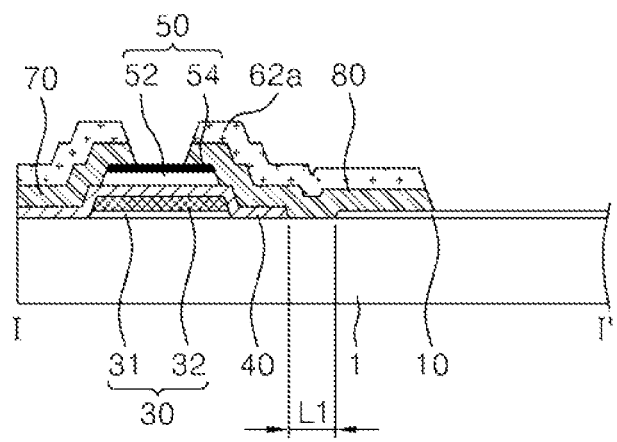
Figure 7C:
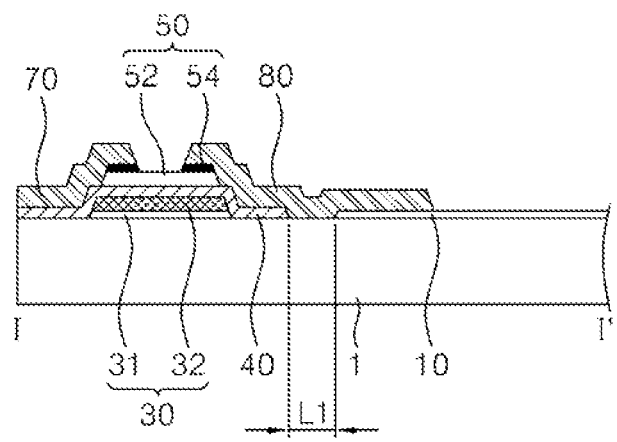

FIGS. 7A to 7C are cross-sectional views showing details of the third mask process in the method of manufacturing the TFT array according to an exemplary embodiment of the present invention.

As shown in FIG. 7A, a third photoresist pattern 62 is formed by exposing and developing a photoresist layer using the third mask on the substrate 1 on which the conductive layer and the photoresist layer are deposited. The third mask is not a slit mask, but rather is a mask having a transmission area and a light-blocking area.

The conductive layer is removed using the third photoresist pattern 62 as an etching mask to form the source electrode 70 and the drain electrode 80. Then, the highly doped n+ hydrogenated amorphous silicon layer 54 between the source electrode 70 and the drain electrode 80 is removed by a dry etching process.

However, since the conductive layer is generally removed by a wet isotropic etching process, the conductive layer is more etched into the third photoresist pattern 62 as shown in FIG. 7A. Then, when the highly doped n+ hydrogenated amorphous silicon layer 54 is removed using the third photoresist pattern 62, the highly doped n+ hydrogenated amorphous silicon layer is exposed outside the source electrode 70 and the drain electrode 80 by a dry isotropic etching process. The highly doped n+ hydrogenated amorphous silicon layer 54 that is exposed outside the source electrode 70 and the drain electrode 80 is called an n+ protrusion portion and deteriorates the performance of the TFT. Accordingly, it is advantageous that there is no or not more than a small n+ protrusion portion.

In this exemplary embodiment, as shown in FIG. 7B, the third photoresist pattern 62 is etched back to form a fourth photoresist pattern 62a to make the fourth photoresist pattern 62a equal to a pattern of the source electrode 70 and the drain electrode 80. Then, the highly doped n+ hydrogenated amorphous silicon layer 54 is removed using the fourth photoresist pattern 62a to obtain an ohmic contact layer 54 having no n+ protrusion portion as shown in FIG. 7C.

According to the exemplary embodiment of the present invention, it is possible to reduce the length of the n+ protrusion portion to less than 0.5 μm.

Figure 8:
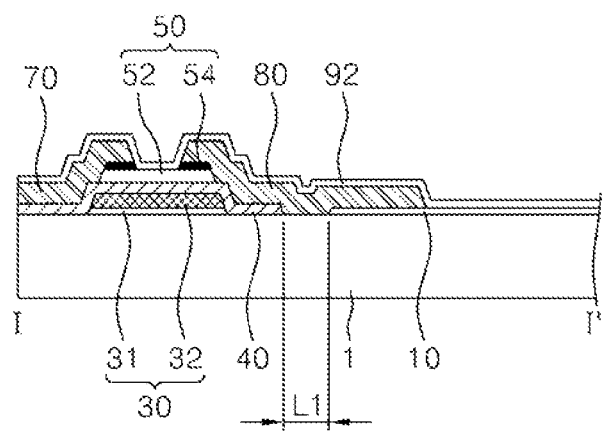
FIGS. 8 and 9 are cross-sectional views showing a protective layer forming process in the method of manufacturing the TFT array according to an exemplary embodiment of the present invention.
Figure 9:
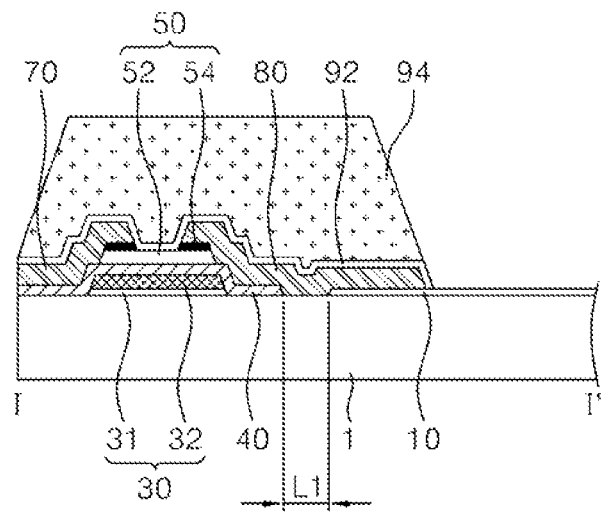

FIGS. 8 and 9 are cross-sectional views showing a process of forming a protective layer in the method of manufacturing the TFT array according to an exemplary embodiment of the present invention.

As shown in FIG. 8, the protective layer 92 is deposited on the entire surface of the substrate 1. The protective layer 92 may be an inorganic insulating layer, an organic insulating layer, or a double layer of an inorganic insulating layer and an organic insulating layer formed thereon. For removing the protective layer 92 formed on the pixel electrode 10, an additional mask may be used. However, in this exemplary embodiment, a column spacer which is a column-shape gap member is used.

In the LCD device using the TFT array, the column spacer is formed on the TFT array or the color filter substrate to maintain the gap between the TFT array and the color filter substrate. In this exemplary embodiment, as shown in FIG. 9, a column spacer 94 is formed to cover the upper portion of the TFT. Then, the protective layer 92 is etched using the column spacer 94 as a mask. Since a column spacer is needed to separate the upper and lower substrates of the LCD device, if the protective layer 92 is etched using the column spacer 94, then it is unnecessary to use an additional mask.

According to the present invention, since the TFT array is manufactured using only three masks, thereby reducing the number of steps in the photolithographic and etching processes, then the manufacturing process is simplified, the time and costs to manufacture are reduced; and the risk of defects in the TFT array is diminished. In particular, in the present invention, two of the three masks have only transmission and light-blocking areas and only one mask is a slit mask. Furthermore, since the slit mask has only a narrow slit area, the manufacturing process using the slit mask is not difficult.

Further, in the present invention, since the drain electrode is formed to overlap the pixel electrode after entirely removing the opaque conductive layer on the pixel electrode, the drain electrode and the pixel electrode have good contact characteristics.

Further, in the present invention, since the source/drain metal layer and the opaque conductive layer of the gate pattern are separately etched, there is no n+ protrusion portion or only a small portion of n+ protrusion portion.

Further, in the present invention, since the width of the slit area between the gate electrode and the pixel electrode is shortly formed, the gate insulating layer does not overlap the pixel electrode. Accordingly, the contact characteristics of the drain electrode and the pixel electrode, and the step coverage of the drain electrode are improved.

Although a disclosure of invention has been provided with reference to particular embodiments, the description is merely an example and should not be taken as a limitation. Various adaptations and combinations of the features of the embodiments disclosed are within the scope of the present teachings.

What is claimed is:

1. A method of manufacturing a thin film transistor array, the method comprising:
   sequentially forming a transparent conductive layer and an opaque conductive layer on a substrate;
   forming a gate pattern having a gate line, a gate electrode, and a pixel electrode by patterning the transparent conductive layer and the opaque conductive layer using a first mask;
   forming a gate insulating layer and a semiconductor layer on the substrate;
   patterning the semiconductor layer and the gate insulating layer using a second mask so that semiconductor layer has a width narrower than a width of the gate electrode in a plan view; and
   patterning the conductive layer and the semiconductor layer to form a source electrode and a drain electrode using a third mask.

2. The method of claim 1, wherein the second mask is a slit mask.

3. The method of claim 2, the end portion of the slit area of the slit mask is arranged between the gate electrode and the pixel electrode so that the gate insulating layer does not overlap the pixel electrode.

4. The method of claim 1, further comprising forming a protective layer on the substrate.

5. The method of claim 1, further comprising forming a column spacer to cover parts of the source electrode and the drain electrode.

6. The method of claim 5, further comprising etching the protective layer using the column spacer as a mask.

7. The method of claim 1, the patterning the conductive layer and the semiconductor layer comprising:
 forming a third photoresist pattern using the third mask;
 patterning the conductive layer using the third photoresist pattern to form a source/drain pattern having a data line, the source electrode, and the drain electrode;
 modifying the third photoresist pattern into a fourth photoresist pattern corresponding to the source/drain pattern; and
 removing an impurity doped amorphous silicon layer of the semiconductor layer between the source electrode and the drain electrode using the fourth photoresist pattern.

8. The method of claim 7, wherein the patterning the semiconductor layer and the gate insulating layer using the second mask comprises:
 forming a first photoresist pattern on the semiconductor layer;
 etching the semiconductor layer and the gate insulating layer using the first photoresist pattern;
 forming a second photoresist pattern by modifying the first photoresist pattern;
 etching the semiconductor layer using the second photoresist pattern; and
 removing the second photoresist pattern.

9. The method of claim 4, wherein the etching the semiconductor layer and the gate insulating layer using the first photoresist pattern comprises removing the semiconductor layer and the gate insulating layer in an area except for the upper portion of the gate line and the gate electrode.

10. The method of claim 4, wherein the removing the opaque conductive layer on the pixel electrode using the second mask is performed before removing the second photoresist pattern.

11. The method of claim 4, wherein the removing the opaque conductive layer on the pixel electrode using the second mask is performed after removing the second photoresist pattern.

12. The method of claim 4, wherein the source/drain pattern overlaps one end of the pixel electrode, and further comprising a storage line formed in parallel with the gate line.

13. The method of claim 12, wherein the etching the semiconductor layer using the second photoresist pattern comprises etching the semiconductor layer so that the semiconductor layer remains in an area where the storage line overlaps the gate line.

* * * * *